United States Patent

Jin et al.

[11] Patent Number: 5,979,739
[45] Date of Patent: Nov. 9, 1999

[54] SEMICONDUCTOR DIE BONDING APPARATUS HAVING MULTIPLE BONDING SYSTEM

[75] Inventors: Ho Tae Jin; Jae Ky Roh; Sung Bok Hong; Hee Kook Choi, all of Cheonan, Rep. of Korea

[73] Assignee: Samsung Electronics Co., Ltd., Suwon, Rep. of Korea

[21] Appl. No.: 08/949,337

[22] Filed: Oct. 14, 1997

[30] Foreign Application Priority Data

Nov. 8, 1996 [KR]  Rep. of Korea ........................ 96-52964

[51] Int. Cl.⁶ .............................. B23K 1/00; B23K 37/00; B23K 1/14
[52] U.S. Cl. .......................... 228/6.2; 228/4.5; 228/49.1
[58] Field of Search .............................. 228/5.7, 6.1, 5.2, 228/4.5, 49.1, 179.1, 180.5, 5.5, 106; 414/935, 940

[56] References Cited

U.S. PATENT DOCUMENTS

| | | | |
|---|---|---|---|
| 4,526,646 | 7/1985 | Suzuki et al. | 156/361 |
| 4,878,610 | 11/1989 | Mori et al. | 228/6.2 |
| 5,173,338 | 12/1992 | Sharp et al. | 427/287 |
| 5,397,423 | 3/1995 | Bantz et al. | 156/362 |
| 5,836,454 | 11/1998 | Evers | 206/723 |

*Primary Examiner*—Patrick Ryan
*Assistant Examiner*—Kiley Stoner
*Attorney, Agent, or Firm*—Jones Volentine, LLP

[57] ABSTRACT

An apparatus for bonding semiconductor dies to lead frame strips, each of the lead frame strips having a plurality of adjacently spaced lead frame units. The apparatus includes at least two bond units, each attaching the dies to one of the lead frame strips at a time and one die supply unit supplying the dies alternately to the bond units. The apparatus also includes at least two lead frame strip supply units, each supplying the lead frame strips to respective ones of the bond units.

14 Claims, 8 Drawing Sheets

SEMICONDUCTOR DIE BONDING APPARATUS HAVING MULTIPLE BONDING SYSTEM

BACKGROUND OF THE INVENTION

1. Field of the Invention

The present invention relates generally to an apparatus for manufacturing semiconductor chip packages, and more particularly to a die bonding apparatus having a multiple bonding system in which semiconductor chips are supplied one by one from a single wafer cassette and bonded to lead frames at more than one position.

2. Description of The Related Art

Figure 1:
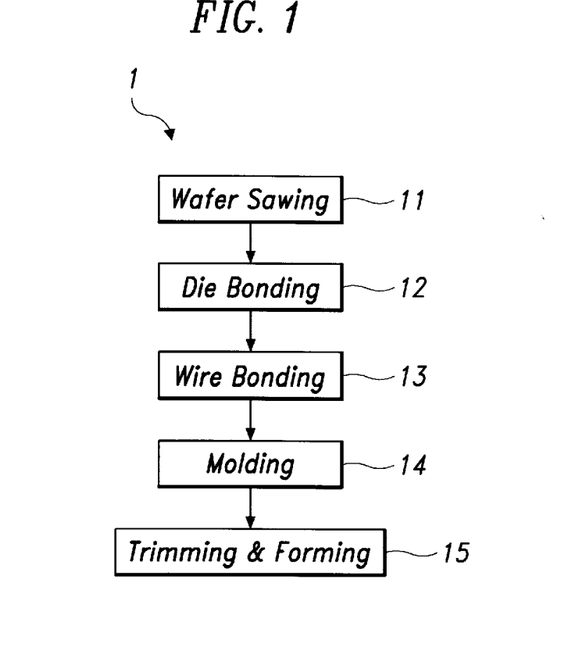
FIG. 1 is a flow chart of a general assembly process for semiconductor integrated circuit (IC) device packages.

Generally, after a wafer fabrication process in which predetermined patterns of integrated circuits (IC) are formed on silicon wafers, the assembly process for semiconductor IC device packages begins. As illustrated in FIG. 1, the assembly process 1 generally consists of a wafer sawing step 11 in which a wafer is cut and divided into a plurality of dies, a die bonding step 12 in which an individual die (or chip) separated from the wafer is mechanically attached to a lead frame unit (one of several that are adjacently arranged along a lead frame strip), a wire bonding step 13 in which the dies are electrically coupled to the lead frame units by means of wires, a molding step 14 in which a package body is formed from a molding compound in order to protect the die, the wires, and connections from hostile environments, and a trimming and forming step 15 in which the individual packages are separated, the outer leads are trimmed, and the package is adapted for mounting on the circuit board.

Figure 2:
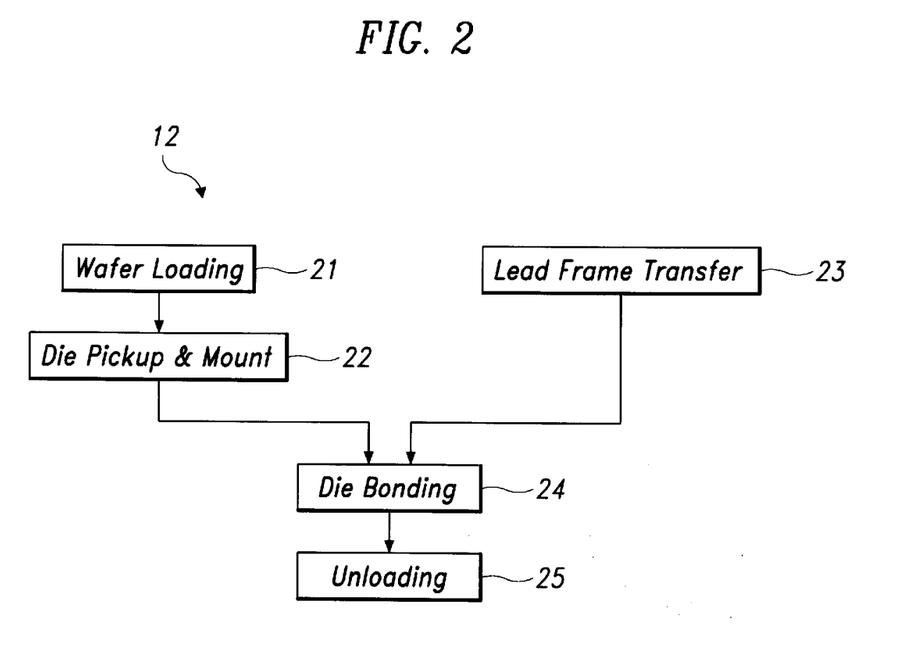
FIG. 2 is a flow chart of the die bonding step of the general package assembly process of FIG. 1.

In particular, the die bonding process 12 is further illustrated in FIG. 2. In wafer loading step 21 the wafer dies, which have already been sawed but remain arranged on a wafer, are supplied to a die bonder. The individual die is separated from the wafer and supplied to a bonding position in a die pickup & mount step 22. A lead frame strip is prepared with adhesive and placed at the bonding position in lead frame transfer step 23. In die bonding step 24 the die and a lead frame unit of the lead frame strip at the bonding position are attached to each other. In unloading step 25 the die-bonded lead frame strip is unloaded from the bonding position and made ready for loading into a wire bonder.

Various methods have been used for the die bonding step 24. These methods, using different adhesive materials, include gold-silicon eutectic die attach, polymer die attach, solid-film polymers die attach, and solder die attach.

The die bonding process 12 is conducted independently from the wire bonding process 13. This requires time, space and labor for the movement of the materials between die bonding process 12 and wire bonding process 13, causing low productivity. A single automated in-line system has recently been developed and proposed to overcome the drawback of the prior independent systems.

Such an automated in-line system is characterized as a single-bonding system. It includes one die bonder connected to more than one wire bonder by means of a transfer rail. Accordingly, the die-bonded lead frame strips can be directly and automatically supplied to the wire bonder. Since the time required for the wire bonding process 13 is longer than the time required for the die bonding process 12, it is possible to connect more than two wire bonders to each die bonder. In these conventional single-bonding systems, the number of wire bonders per die bonder ranges from two to six.

However, in the case of lead-on-chip (LOC) packages in which a solid-film polymer such as polyimide tape is used as a bonding material for attaching dies to a lead frame, the die bonding time required is longer than that for packages using other bonding materials. Accordingly, only one or two wire bonders are connected to one die bonder, which results in less of an advantage for the conventional single-bonding in-line systems.

A need exists, therefore, for a die bonding apparatus that provides more bonded lead frames per unit time, especially for LOC packages, to feed the plurality of wire bonders connected in an automated in-line system.

SUMMARY OF THE INVENTION

It is therefore an object of the present invention to provide die bonding apparatuses, each of which has a multiple bonding system in which semiconductor chips are supplied one by one from a single wafer cassette and respectively bonded to lead frame strips at multiple bonding positions.

It is another object of the present invention to provide automated in-line systems in which a die bonding apparatus with a multiple bonding system and a plurality of wire bonding apparatuses are connected to each other.

These and other objects of the present invention can be achieved by an apparatus for bonding individual semiconductor dies to lead frame strips. Each of the lead frame strips has a plurality of adjacently spaced lead frame units. The apparatus comprises at least two bond units, each attaching the dies to one of the lead frame strips at a time, and one die supply unit supplying the dies alternately to the bond units. The apparatus also includes at least two lead frame strip supply units each supplying the lead frame strips to respective ones of the bond units.

BRIEF DESCRIPTION OF THE DRAWINGS

The foregoing and other objects, aspects, and advantages will be described with reference to the accompanying drawings, in which.

DETAILED DESCRIPTION OF THE INVENTION

The invention is directed to a semiconductor die bonding apparatus having a multiple bonding system for use in an automated in-line system for semiconductor IC device package assembly. The present invention will be described with reference to the accompanying drawings, where like numerals refer to like elements throughout.

Figure 3:
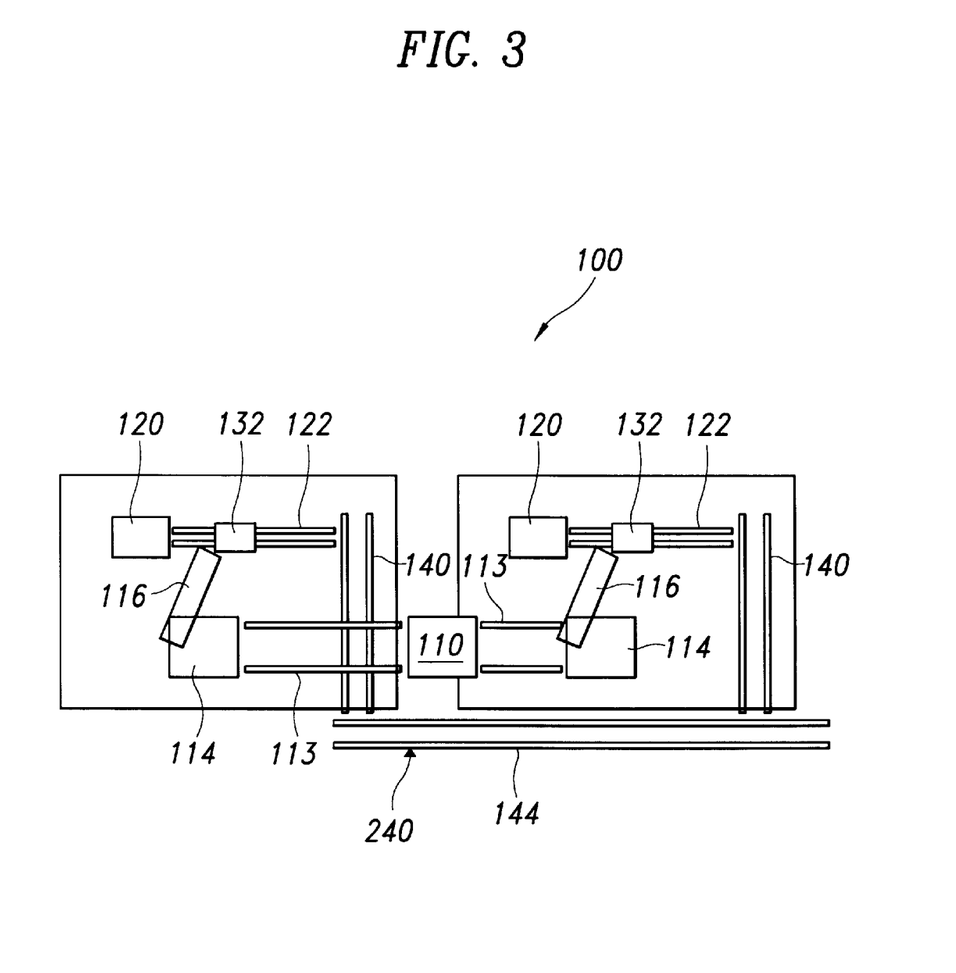
FIG. 3 is a diagram of an embodiment of a die bonding apparatus according to the present invention.
Figure 4:
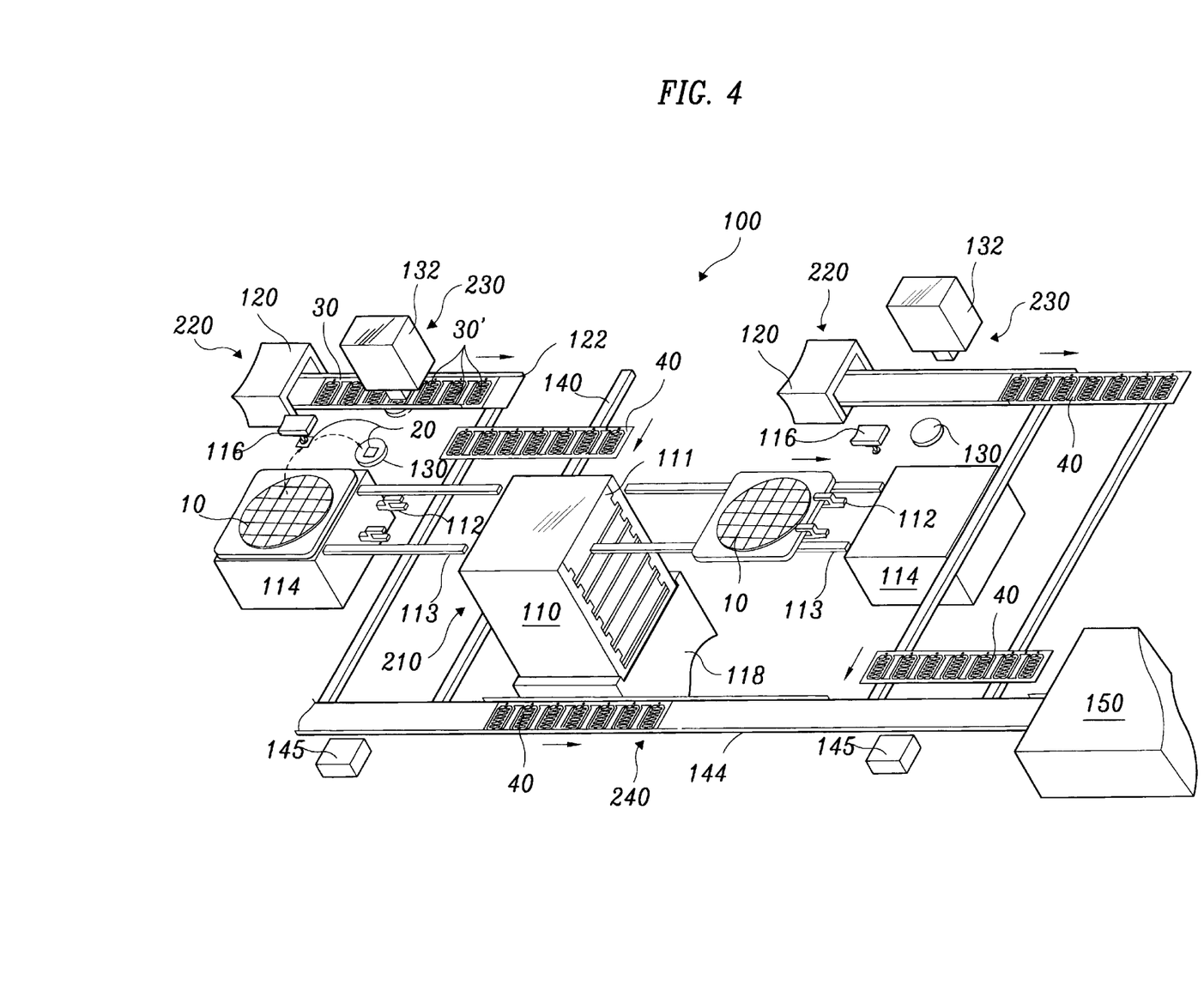
FIG. 4 is a perspective view of the die bonding apparatus of FIG. 3.

FIG. 3 is a diagram of an embodiment of a die bonding apparatus 100 according to the present invention; and FIG. 4 is a perspective view of the die bonding apparatus 100 of FIG. 3.

Generally, as shown in FIG. 3 and FIG. 4, the die bonding apparatus 100 comprises one die supply unit 210, at least two lead frame strip supply units 220, and at least two bond units 230. The die supply unit 210 supplies dies 20 to all the bond units 230 in sequence, with each of the bond units having a corresponding lead frame strip supply unit 220. For example, in FIG. 4, one lead frame strip supply unit 220 supplies lead frame strips 30 to one of the bond units 230, and the other lead frame strip supply unit 220 supplies lead frame strips 30 to the other bond unit 230. Therefore, each of the bond units 230 can independently perform the process of attaching a die 20 to a lead frame unit 30' of the lead frame strip 30 at each bonding position.

More specifically, in the embodiment shown in FIG. 4, the one die supply unit 210 includes one wafer cassette 110, two wafer loaders 112, two die separator tables 114, and two die pick-up tools 116. Optionally, a cassette lift 118 is included. Each of the lead frame strip supply units 220 includes a lead frame strip magazine 120 and a pair of transfer rails 122. Each of the bond units 230 includes a bonding stage 130 and a bonding head 132.

In the die supply unit 210, the wafer cassette 110 contains a plurality of wafers 10 each of which has a plurality of dies 20. The wafer loaders 112 are located to obtain access to wafers 10 in the cassette 110 and to access the die separator tables 114. For example, in the embodiment of FIG. 4, two wafer loaders 112 are respectively located near opposite sides of the wafer cassette 110. The wafers 10 in the cassette 110 are picked up in turn by each loader 112 and then loaded one by one onto the die separator tables 114. Various types of wafer loaders 112 can be used in the die supply unit 210. For example, in addition to the gripping type wafer loaders 112 shown, pushers and rollers or other equivalent devices can be used as alternatives.

In FIG. 4, rails 113 provide a transfer route for the wafer 10 or the loader 112, but other means can be used by the loader 112. For example, if the cassette 110 had two entrances to provide access for the loaders 112 at opposite sides of the cassette 110, both loaders 112 could easily pick up the wafers 10 in turn or simultaneously from the cassette 110. Since the more commonly used cassette 110 has one entrance, both loaders 112 cannot remove wafers 10 from the cassette 110 simultaneously. Accordingly, after one loader 112 removes one wafer 10, the cassette lift 118 supporting the cassette 110 should rotate to face toward the other loader 112 so that the next wafer 10 can be removed by this loader 112.

Figure 5A:
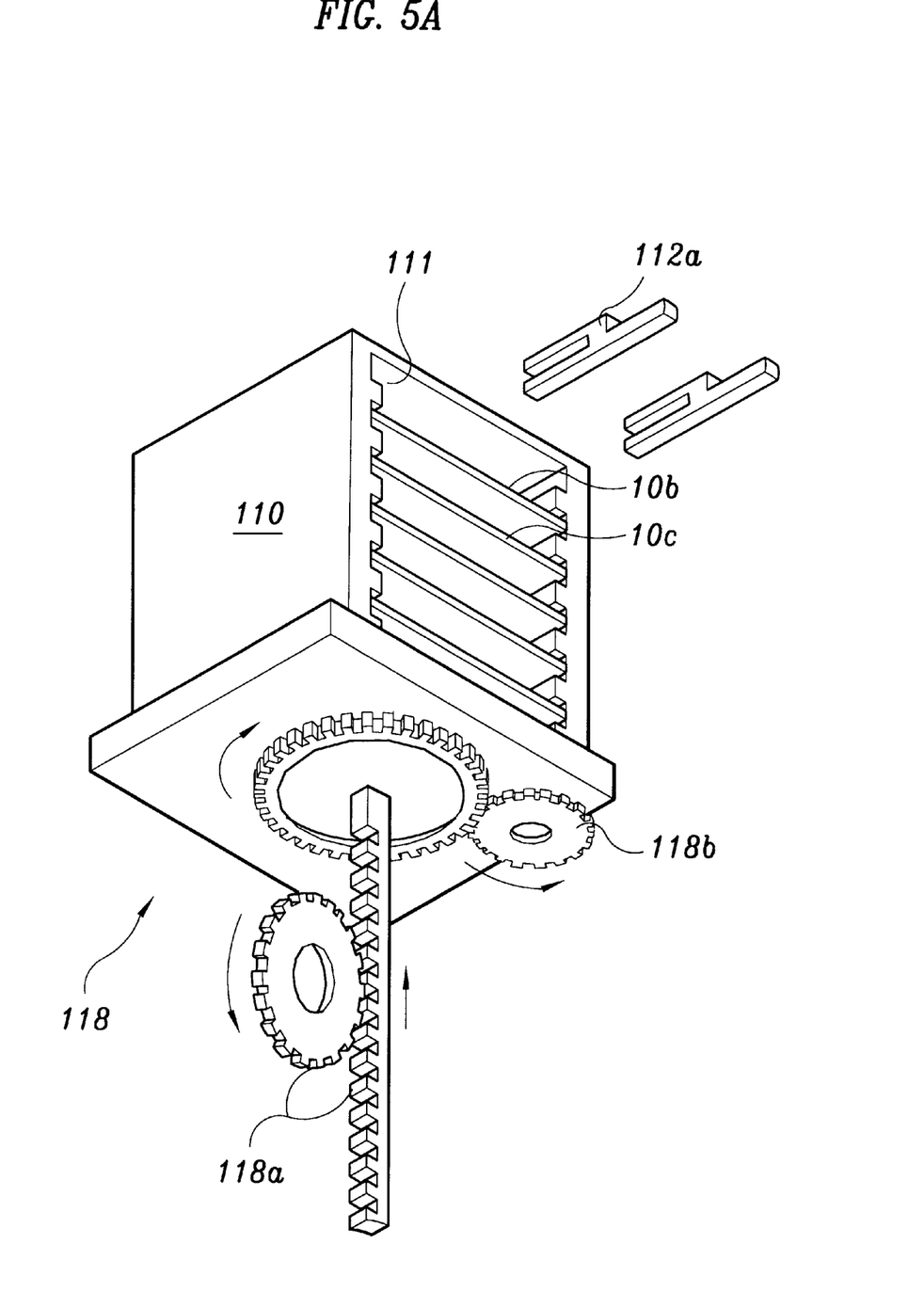
FIGS. 5A and 5B are perspective views showing an embodiment of a cassette lift for the die bonding apparatus of FIG. 4, and the movement thereof.
Figure 5B:
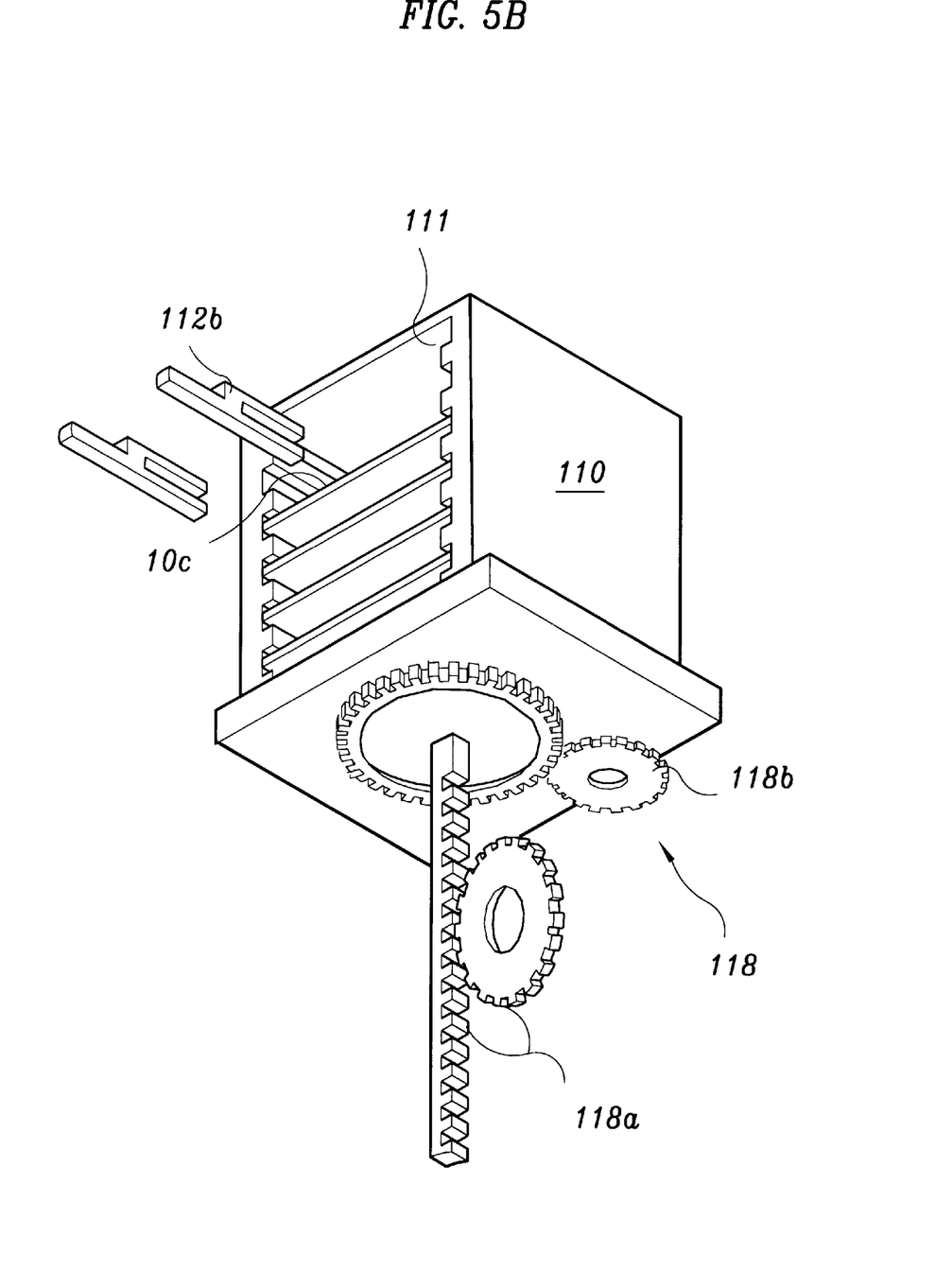

The cassette lift 118 thus not only supports the cassette 110 but also makes the latter rotate or move up and down as needed. An exemplary embodiment of the cassette lift 118 and the movement thereof are illustrated in FIG. 5A and FIG. 5B. Once a first loader 112a picks up one of the wafers, e.g., 10b of FIG. 5A, from the cassette 110, the lift 118 moves up by one step and rotates toward a second loader 112b. Then another wafer, e.g., 10c of FIG. 5B, in the cassette 110 can be removed because the entrance 111 of the cassette 110 is facing toward the second loader 112b. The lift 118 is moved up and down by gears 118a and rotated by gears 118b. Other means such as a cam, belt, or chain, as well as the gear, may be used alternatively for driving the lift 118.

Referring again to FIG. 3 and FIG. 4, the die separator table 114 is the location where the dies 20 are separated from the wafer 10. The dies 20 of the wafer 10 had already been sawed into individual dies before being loaded into the cassette 110. An adhesive tape is fixed to the bottom of the die to keep them in the place. Therefore, one die 20 is easily separated from its taped position in the wafer 10 when the die pick-up tool 116 above the table 114 picks up the die 20 at the same time that an eject pin (not shown) under the table 114 pushes it up, thereby freeing the die from the tape. The die pick-up tool 116 may include, for example, a vacuum generation pipe for picking up the die 20, and an arm for guiding the movement of the tool 116.

Each of the lead frame strip supply units 220 comprises, as described above, the lead frame strip magazine 120 and the pair of transfer rails 122. A plurality of lead frame strips 30 to be die-bonded are contained in the magazine 120. The transfer rails 122 are located near the magazine 120 and extend to the bond unit 230. A means such as a pusher, gripper, roller, finger, pin, or vacuum (not shown), facilitates transference of the lead frame strip 30 from the magazine 120 to the rails 122 or from one place to another along the rails 122. Furthermore, equipment for applying the adhesive material to the lead frame strip 30 may be installed between the magazine 120 and the bond unit 230.

As described above, the dies 20 and the lead frame strip 30 are supplied to the corresponding bond unit 230 and then mechanically bonded to each other. Each of the bond units 230 includes the bonding stage 130 and the bonding head 132. The bonding stage 130 under the rail 122 and the bonding head 132 above the rail 122 can move toward each other and generate heat. Therefore, the die 20 and the lead frame unit 30' of the lead frame strip 30 are thermally compressed by both the stage 130 and the head 132. Consequently, the die 20 and the lead frame unit 30' are firmly bonded.

The die 20 is attached to either the top or bottom surface of the lead frame unit 30' of the lead frame strip 30. The die 20 can be directly supplied and mounted to the lead frame unit 30' of the lead frame strip 30 by the die pick-up tool 116 for fabricating die-on-lead packages. For fabricating LOC packages, the die 20 is placed on the bonding stage 130 by the die pick-up tool 116 and then positioned under the lead frame unit 30' of the lead frame strip 30 by movement of the stage 130, as shown in FIG. 4. Furthermore, the dies 20 may be arranged at a certain place before being positioned in the bond unit 230. The bonding stage 130 in FIG. 4 can be used as the die arrangement location. After each lead frame strip 30 has had dies attached, the lead frame strip 30 becomes a die-bonded lead frame strip 40.

The die bonding apparatus 100 further comprises an unload unit 240 to unload the die-bonded lead frame strip 40. The unload unit 240 may be divided into at least two first sections 140 and one second section 144. Each first section 140 of the unload unit 240 is positioned perpendicularly to each transfer rail 122, and the one second section 144 is perpendicularly connected to all the first sections 140. The die-bonded lead frame strips 40 from each bonding unit 230 are provided to a corresponding first section 140 and then unloaded one by one to the second unload section 144. Some sensors 145 may be installed in the second unload section 144, one sensor corresponding to each first unload section 140, so as to facilitate alternate unloading of die-bonded lead frame strips 40 to the second section 144.

FIGS. 6A to 6D are perspective views showing one embodiment of a first section 140 of an unload unit for the die bonding apparatus of FIG. 4, and the movement thereof. FIGS. 7A to 7C are schematic views for illustrating an unloading mechanism of the unload unit of the die bonding apparatus of FIG. 4.

Figure 6A:
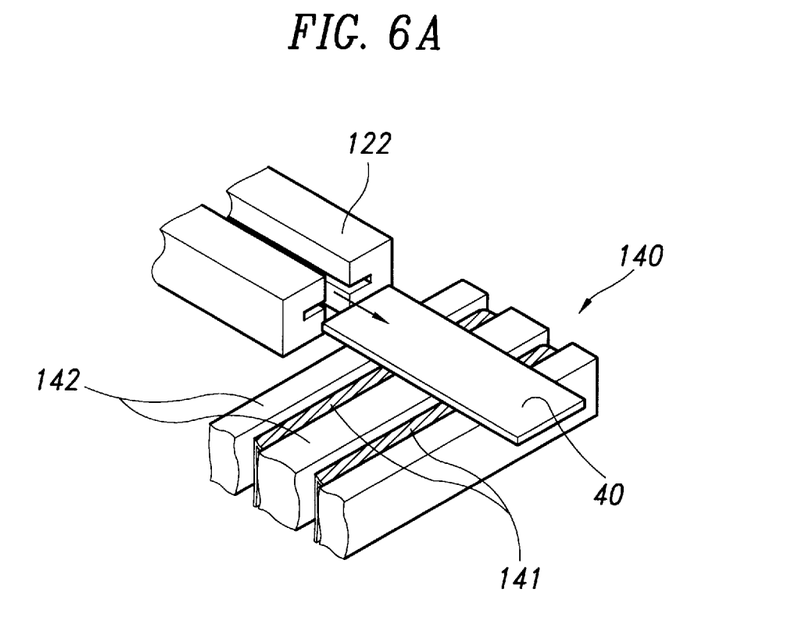
FIGS. 6A to 6D are perspective views showing an embodiment of a first section of an unload unit for the die bonding apparatus of FIG. 4, and the movement thereof; and, FIGS. 7A to 7C are schematic plan views for illustrating an unloading mechanism for the unload unit of the die bonding apparatus of FIG. 4.
Figure 6B:
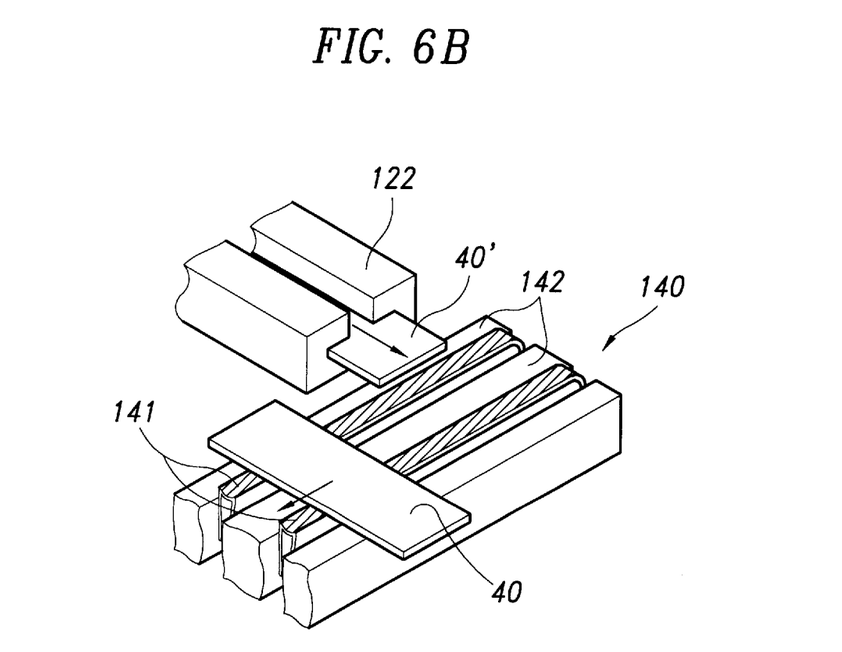
Figure 6C:
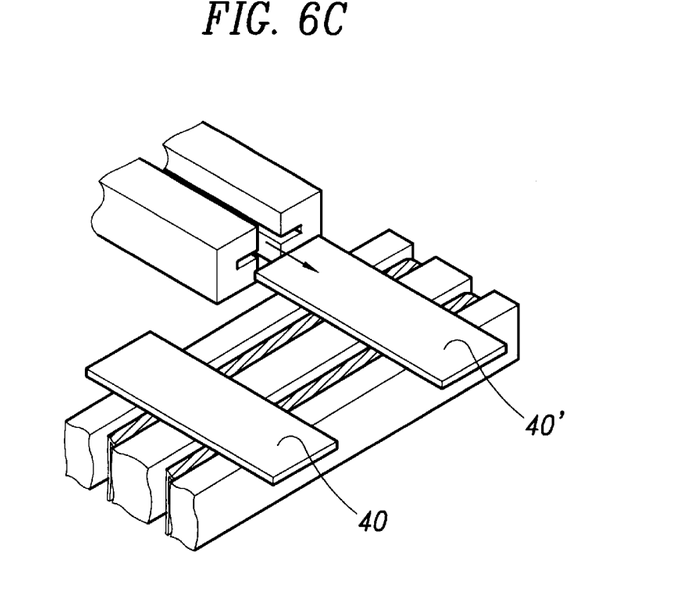
Figure 6D:
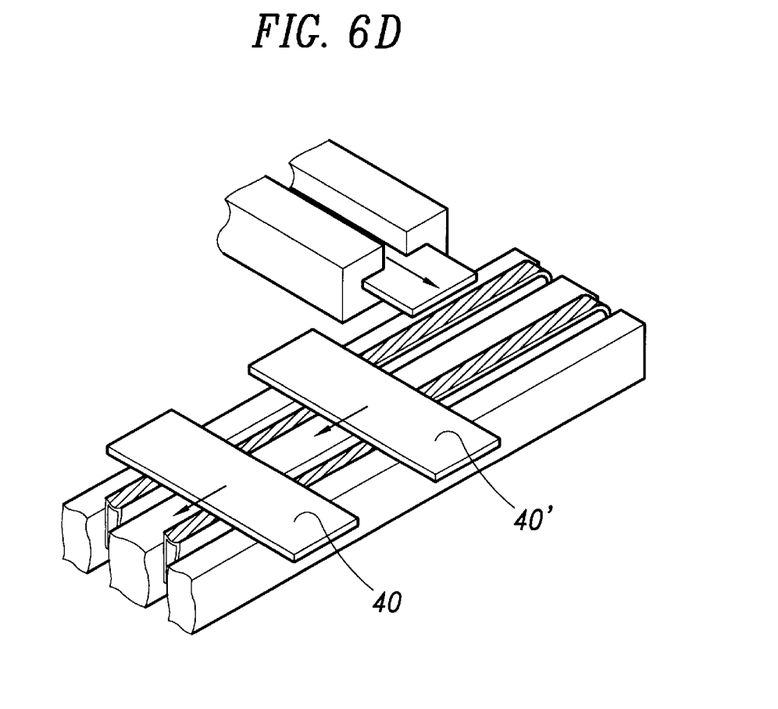
Figure 7A:
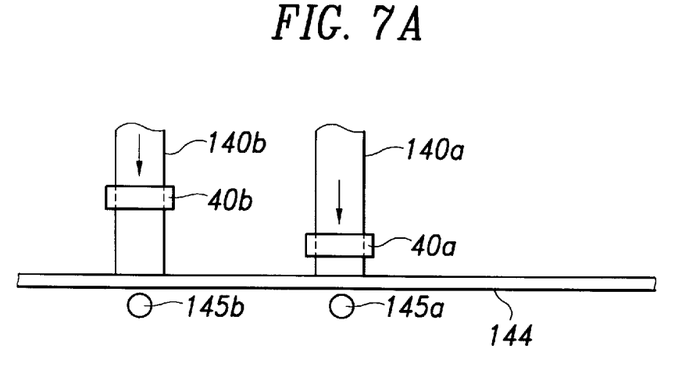
Figure 7B:
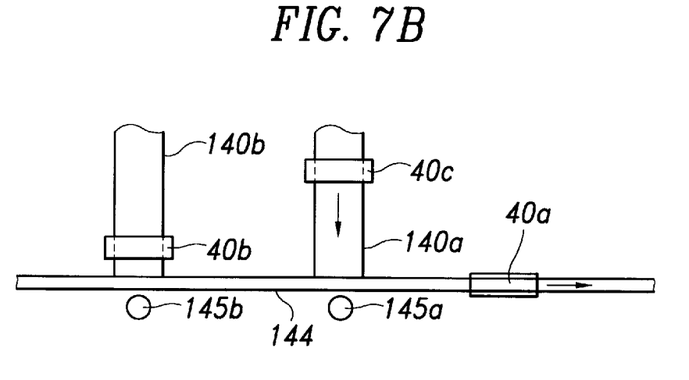
Figure 7C:
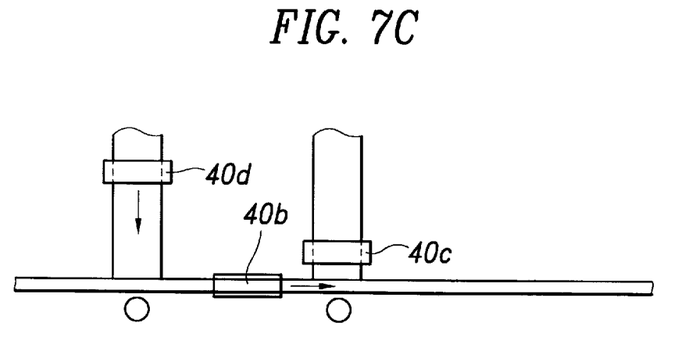

Referring to FIG. 6A, the lead frame strip 40 transferred through each rail 122 is provided to the corresponding first unload section 140. Each first section 140 moves the provided die-bonded lead frame strip 40 incrementally toward the second section 144. For example, as shown in FIG. 6A, each first unload section 140 is composed of conveyer belts 141 and support blocks 142. The conveyer belts 141 between the support blocks 142 are located below the top of the blocks 142. The die-bonded lead frame strip 40 is placed on the top of the blocks 142, then the conveyer belts 141 rise above the blocks 142, as shown in FIG. 6B, and carry the lead frame strip 40. The conveyer belts 141 go down after moving an incremental distance, as seen in FIG. 6C, when the next lead frame strip 40' is successively provided from the rail 122 to the first unload section 140. This makes it possible for the next lead frame strip 40' to be placed on the block 142. FIG. 6D illustrates that the lead frame strips 40 and 40' are incrementally carried on the conveyer belts 141. The lead frame strips 40 can be carried by using this method all the way to the second unload section 144.

The die-bonded lead frame strips 40 in all the first unload sections 140, as schematically illustrated in FIG. 7 for the case of two first unload sections 140a and 140b, are provided to the second unload section 144. Therefore, a means for controlling the unloading process of the lead frame strips 40 is needed. This control can be provided by placing sensors 145a, 145b in the second unload section 144 near each first unload section 140a, 140b, respectively. That is, the successive unloading of the die-bonded lead frame strips 40 is controlled by the sensors 145a, 145b. For instance, if the second load section 144 moves from left to right, the lead frame strip 40a in the first unload section 140a on the right side arrives at the second unload section 144 ahead of the lead frame strip 40b in the other first unload section 140b (see FIG. 7A), a sensor 145a on the right side perceives the lead frame strip 40a. The sensor 145a then allows the lead frame strip 40a to be unloaded to the second unload section 144, as shown in FIG. 7B. During the unloading of the lead frame strip 40a, the other lead frame strip 40b is stopped before the second unload section 144, and another lead frame strip 40c is placed on the first unload section 140a on the right side. Subsequently, the left lead frame strip 40b is unloaded by sensing of sensor 145b, the right lead frame strip 40c is stopped by sensing of sensor 145a, and the next left lead frame strip 40d is placed on the first unload section 140b on the left side, as shown in FIG. 7C.

The die bonding apparatus 100 is preferably connected, as shown in FIG. 4, with a plurality of wire bonding apparatuses 150 by the unload unit 240. In this case, the second unload section 144 can play a role in supplying the die-bonded lead frame strips 40 to the wire bonding apparatuses 150. Thus the multiple bonding system becomes part of an automated in-line assembly system for semiconductor device IC packages.

The die bonding apparatus discussed above including one die supply unit, at least two lead frame strip supply units, and at least two bond units can thus obtain increased productivity and reduced cost. Furthermore, the die bonding apparatus having a multiple-bonding system can attain the productivity of multiple die bonders while requiring less area, fewer manual operations, less personnel, and fewer resources. In particular, the die bonding apparatus may be useful for an automated in-line system for the fabrication of semiconductor device IC packages, including the manufacturing of LOC packages.

The drawings and specification have disclosed the invention and examples of preferred embodiments of the invention in which a double-bonding system is illustrated. However, other die bonding apparatuses may be included within the scope of the invention. For example, die bonders using a multiple bonding system, die bonders separated from wire bonders, and die bonders used for manufacturing various packages, can be embodied. Also, more than two bonding units may be provided with one or more unloading units.

It will be apparent to those skilled in the art that various modifications and variations can be made in the system and method of the present invention without departing from the spirit or scope of the invention. Thus, it is intended that the present invention cover the modifications and variations of this invention that come within the scope of the appended claims and their equivalents.

Having thus described our invention, what we claim as new and desire to secure by letters patent is as follows:

1. An apparatus for bonding semiconductor dies to lead frame strips, each of the lead frame strips having a plurality of adjacently spaced lead frame units, comprising:

at least two bond units, each independently attaching the dies to one of the lead frame strips at a time;

one die supply unit supplying the dies alternately to the bond units; and at least two lead frame strip supply units, each supplying the lead frame strips to respective ones of the bond units.

2. The apparatus of claim 1, wherein the die supply unit supplies the dies one by one from a wafer having a plurality of dies.

3. The apparatus of claim 2, the die supply unit comprising at least one die pick-up tool.

4. The apparatus of claim 1, the die supply unit comprising:

a wafer cassette holding a plurality of wafers, each having a plurality of dies;

at least two die separator tables, each for separating the plurality of dies from one of the plurality of wafers at a time;

at least two wafer loaders, each for loading one of the plurality of wafers in the wafer cassette onto respective one of the die separator tables; and at least two die pick-up tools, each for picking up one of the dies from the one wafer on respective ones of the die separator tables and then mounting the die onto respective ones of the bond units.

5. The apparatus of claim 4, the die supply unit further comprising:

a cassette lift for supporting and moving the wafer cassette so that any wafer of the plurality of wafers in the cassette can be loaded by either one of the wafer loaders.

6. The apparatus of claim 1, each of the lead frame strip supply units comprising:

a lead frame strip magazine holding a plurality of the lead frame strips; and a transfer rail for moving each lead frame strip from the magazine to the bond unit.

7. The apparatus of claim 6, each of the bond units comprising:

a bonding head located above the transfer rail; and a bonding stage located below the transfer rail, for attaching one of the dies to one of the lead frame units on one of the lead frame strips.

8. The apparatus of claim 1, further comprising an unload unit communicating with the bond units, wherein each of the lead frame strips on which the dies have been attached is unloaded from the bond units.

9. The apparatus according to claim 8, wherein the unload unit delivers the lead frame strips on which the dies have been attached to a plurality of wire bonding apparatuses.

10. An apparatus for bonding semiconductor dies to lead frame strips, each of the lead frame strips having a plurality of adjacently spaced lead frame units, comprising:

one wafer cassette holding a plurality of wafers, each of the wafers having a plurality of dies;

two wafer loaders, each for removing one of the wafers from the wafer cassette and loading the one wafer onto a respective one of two die separator tables;

two die pick-up tools, each for picking up one of the dies from a wafer on the respective die separator table;

two lead frame strip magazines, each holding a plurality of lead frame strips;

two transfer rails, each for moving the lead frame strips from the respective one of the magazines;

two bonding stages, each located under the respective transfer rail, wherein a die picked up by one of the die pick-up tools is mounted on the respective bonding stage; and two bonding heads, each located above the respective transfer rail, wherein the bonding stages move up and the bonding heads move down to thermally compress the dies on the bonding stages against the lead frame units of the lead frame strips on the transfer rails, whereby each of the dies on the bonding stages is attached to a respective lead frame unit.

11. The apparatus of claim 10, further comprising a cassette lift for supporting and moving the wafer cassette so that, after a first wafer of the plurality of wafers in the cassette is removed by a first wafer loader of the two wafer loaders, the cassette lift moves up and rotates toward a second wafer loader of the two wafer loaders so that a second wafer of the plurality of wafers in the cassette is removed by the second wafer loader.

12. The apparatus of claim 10, further comprising an unload unit communicating with the bond units, wherein each of the lead frame strips on which the dies have been attached is unloaded from the bond units.

13. The apparatus according to claim 12, wherein the unload unit delivers the lead frame strips on which the dies have been attached to a plurality of wire bonding apparatuses.

14. The apparatus according to claim 10, wherein the bonding heads and bonding stages are oriented for manufacturing lead on chip (LOC) packages.

\* \* \* \* \*